US007663178B2

(12) United States Patent
Arai et al.

(10) Patent No.: US 7,663,178 B2
(45) Date of Patent: Feb. 16, 2010

(54) NONVOLATILE SEMICONDUCTOR MEMORY WITH RESISTANCE ELEMENTS AND METHOD OF MANUFACTURING THE SAME

(75) Inventors: Fumitaka Arai, Yokohama (JP); Atsuhiro Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 11/850,978

(22) Filed: Sep. 6, 2007

(65) Prior Publication Data

US 2008/0061349 A1  Mar. 13, 2008

(30) Foreign Application Priority Data

Sep. 8, 2006 (JP) ............................. 2006-244557

(51) Int. Cl.
*H01L 29/72* (2006.01)
(52) U.S. Cl. ...................... 257/315; 257/316; 257/332; 257/401; 257/510; 257/536
(58) Field of Classification Search ................. 257/315, 257/316, 332, 401, 510, 536
See application file for complete search history.

(56) References Cited

U.S. PATENT DOCUMENTS 6,346,736 B1 * 2/2002 Ukeda et al. ................ 257/509
7,242,049 B2 * 7/2007 Forbes et al. ................ 257/315
7,358,135 B2 * 4/2008 Park ........................... 438/257
2005/0127400 A1 * 6/2005 Yeo et al. .................... 257/194
2006/0281244 A1   12/2006 Ichige et al.

FOREIGN PATENT DOCUMENTS

JP          9-92736        4/1997

OTHER PUBLICATIONS

U.S. Appl. No. 11/853,544, filed Sep. 11, 2007, Arai, et al.

* cited by examiner

*Primary Examiner*—Edward Wojciechowicz
(74) *Attorney, Agent, or Firm*—Oblon, Spivak, McClelland, Maier & Neustadt, L.L.P.

(57) ABSTRACT

A nonvolatile semiconductor memory of an aspect of the present invention comprises a memory cell transistor and a resistance element arranged on a semiconductor substrate. The memory cell transistor includes a floating gate electrode constituted of a first conductive material arranged on a gate insulating film on a surface of the semiconductor substrate, an inter-gate insulating film arranged on the floating gate electrode, a control gate electrode arranged on the inter-gate insulating film, and a source/drain diffusion layer provided in the semiconductor substrate. The resistance element includes an element isolation insulating layer arranged in the semiconductor substrate and including a depression, and a resistor constituted of a second conductive material filling up the depression. An impurity concentration of the second conductive material is lower than that of the first conductive material.

8 Claims, 10 Drawing Sheets

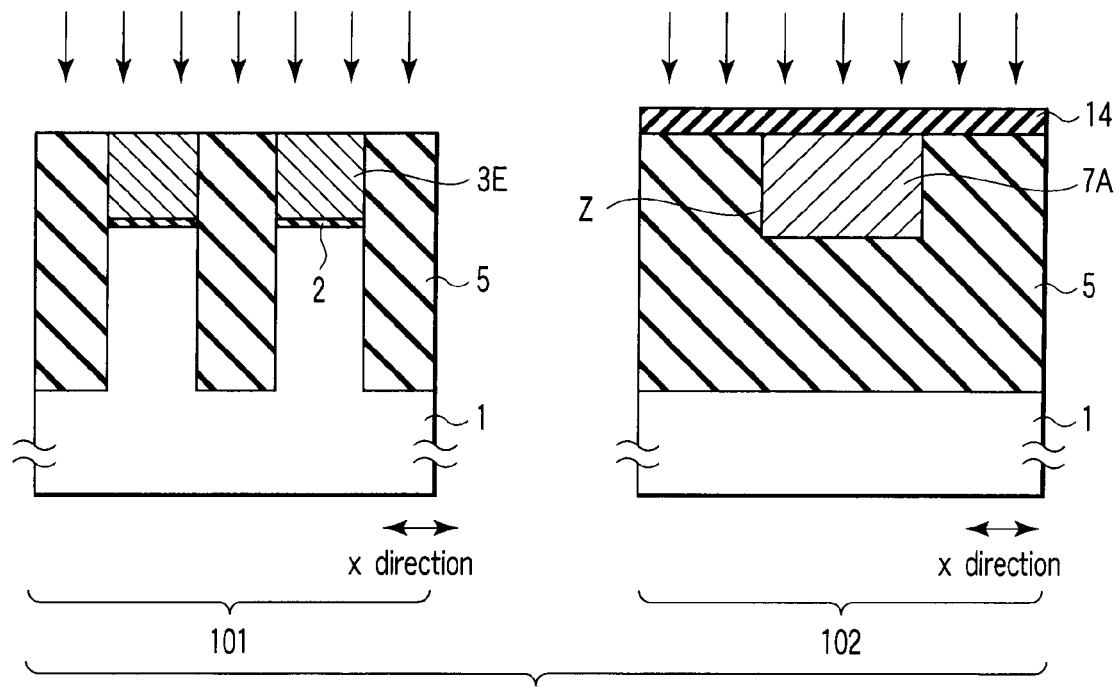
F I G. 17
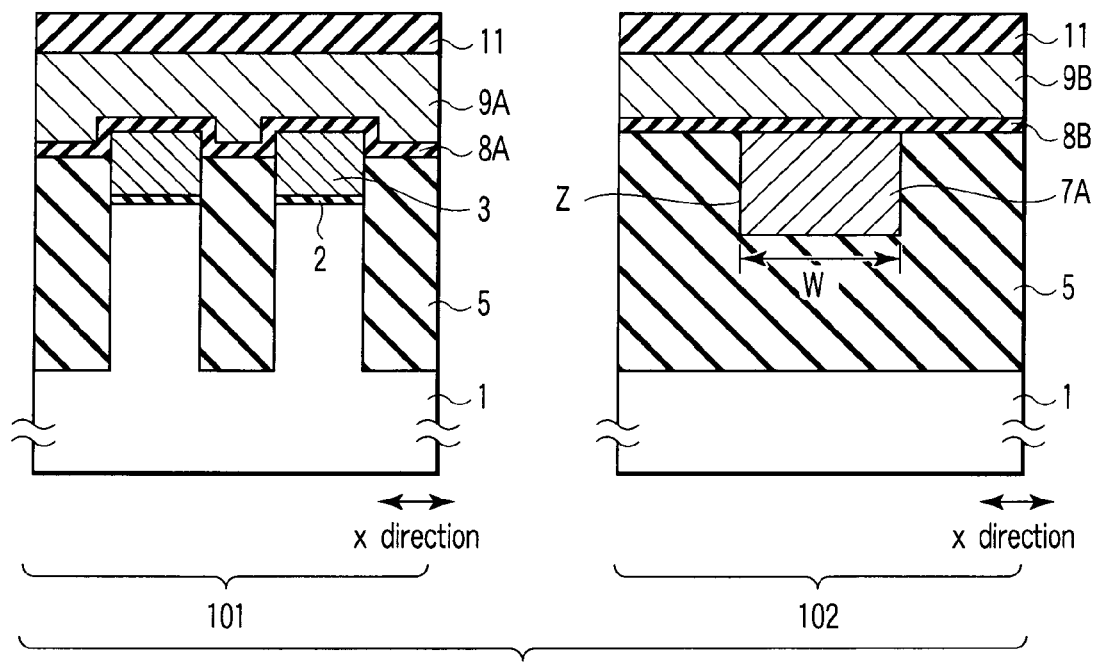
F I G. 18

NONVOLATILE SEMICONDUCTOR MEMORY WITH RESISTANCE ELEMENTS AND METHOD OF MANUFACTURING THE SAME

CROSS-REFERENCE TO RELATED APPLICATIONS

This application is based upon and claims the benefit of priority from prior Japanese Patent Application No. 2006-244557, filed Sep. 8, 2006, the entire contents of which are incorporated herein by reference.

BACKGROUND OF THE INVENTION

1. Field of the Invention

The present invention relates to a nonvolatile semiconductor memory and a method of manufacturing the same and, more particularly, to a flash memory.

2. Description of the Related Art

Nonvolatile semiconductor memories such as NAND type flash memories are mounted on various electronic equipments. Further, such a nonvolatile semiconductor memory is constituted of a circuit including transistors and resistance elements. The resistance element is required to have a high resistivity for the purpose of chip size reduction, and enable a stable characteristic to be obtained, and various manufacturing methods are studied (for example, Jpn. Pat. Appln. KOKAI Publication No. 9-92736).

As one of the manufacturing methods, there is a technique in which a resistor of a resistance element is formed of the same material as that of the floating gate electrode of a memory cell transistor simultaneously with the floating gate electrode thereof.

However, in the floating gate electrode, a polysilicon film having a high impurity concentration and a low resistivity is used so as to avoid depletion of the gate. For this reason, it is impossible to avoid using a resistor having a high impurity concentration, thereby lowering the resistivity of the resistor.

Accordingly, in order to obtain a desired resistance value, in the shape of the resistor, a length must be long, and the line width (cross section) must be small.

Therefore, an area on a chip occupied by the resistance element is increased and the line width is made small, thereby making it also difficult to obtain a stable resistance value.

BRIEF SUMMARY OF THE INVENTION

A nonvolatile semiconductor memory of an aspect of the present invention comprising: a memory cell transistor and a resistance element arranged on a semiconductor substrate, the memory cell transistor including a floating gate electrode constituted of a first conductive material arranged on a gate insulating film on a surface of the semiconductor substrate; an inter-gate insulating film arranged on the floating gate electrode; a control gate electrode arranged on the inter-gate insulating film; and a source/drain diffusion layer provided in the semiconductor substrate, the resistance element including an element isolation insulating layer arranged in the semiconductor substrate and including a depression; and a resistor constituted of a second conductive material filling up the depression, wherein an impurity concentration of the second conductive material is lower than that of the first conductive material.

A method of manufacturing a nonvolatile semiconductor memory of an aspect of the present invention comprising: forming a floating gate electrode material of a memory cell transistor on a gate insulating film on a surface of a semiconductor substrate; forming an element isolation insulating layer in the semiconductor substrate; forming a depression in the element isolation insulating layer; filling up the depression with a resistor of a resistance element; forming an inter-gate insulating film of the memory cell transistor and an intermediate insulting film of the resistance element simultaneously on top surfaces of the floating gate electrode material and the resistor, respectively; and forming a control gate electrode of the memory cell transistor and an intermediate layer of the resistance element simultaneously on top surfaces of the inter-gate insulating film and the intermediate insulating film, respectively.

A method of manufacturing a nonvolatile semiconductor memory of an aspect of the present invention comprising: forming a foundation layer on a gate insulating film on a surface of a semiconductor substrate; forming an element isolation insulating layer in the semiconductor substrate; forming an epitaxial film selectively on the foundation layer; forming a depression in the element isolation insulating layer; filling up the depression with a resistor of a resistance element; forming a cover film on the resistor; forming a floating gate electrode by doping impurities into the epitaxial film; removing the cover film; forming an inter-gate insulating film of a memory cell transistor and an intermediate insulting film of the resistance element simultaneously on top surfaces of the floating gate electrode and the resistor, respectively; and forming a control gate electrode of the memory cell transistor and an intermediate layer of the resistance element simultaneously on top surfaces of the inter-gate insulating film and the intermediate insulating film, respectively.

BRIEF DESCRIPTION OF THE SEVERAL VIEWS OF THE DRAWING

FIG. 17 shows cross-sectional views showing a step of the second manufacturing method.

FIG. 18 shows cross-sectional views showing a step of the second manufacturing method.

DETAILED DESCRIPTION OF THE INVENTION

Some configurations for carrying out examples of the present invention will be described below in detail with reference to the accompanying drawings.

1. Outline

A nonvolatile semiconductor memory in an example of the present invention is characterized in that a resistor of a resistance element is buried in a depression formed in an element isolation insulating layer, and an impurity concentration of this resistor is lower than that of a floating gate electrode of a memory cell transistor.

In order to obtain such a structure, the floating gate electrode and the resistor are formed in different steps.

By forming the floating gate electrode and the resistor which differ from each other in impurity concentration in different steps as described above, it is possible to form the floating gate electrode by using a material having a high impurity concentration and avoid depletion of the gate.

On the other hand, the resistor can be formed by using a material having a low impurity concentration, i.e., a material having a high resistivity. Accordingly, by burying a resistor having a high resistivity in the depression, it is possible to form a resistance element in which a shape and a characteristic of the resistor are optimized on a semiconductor substrate and, moreover reduce a chip size. Furthermore, it is also possible to reduce a capacity produced between the resistor and the semiconductor substrate.

Further, in the example of the present invention, a manufacturing method by which the above-mentioned structure can be obtained is also proposed.

2. Embodiment (1) Structure

A structure of a memory cell region and a resistor region of a nonvolatile semiconductor memory in the embodiment of the present invention will be described below with reference to FIGS. 1 to 3. In this embodiment, a memory cell provided in the memory cell region will be described by taking a memory cell transistor having a stacked structure constituted of a floating gate electrode and a control gate electrode as an example.

Figure 1:
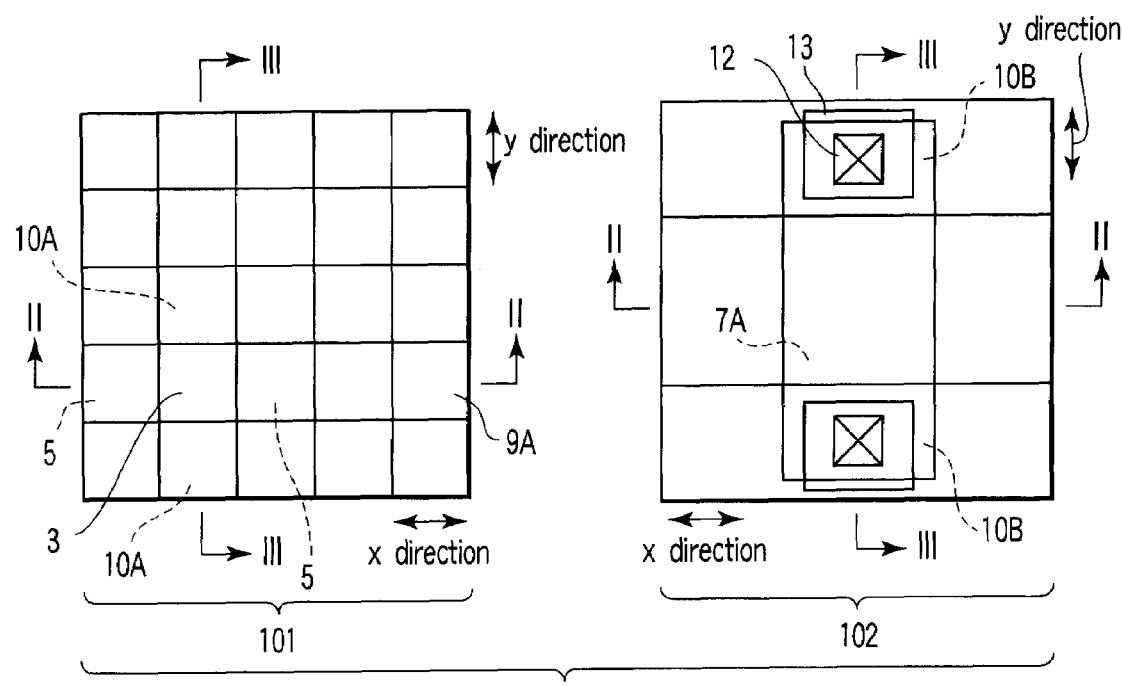
FIG. 1 shows plan views showing a structure of a memory cell region and a resistor region of an embodiment of the present invention.
Figure 2:
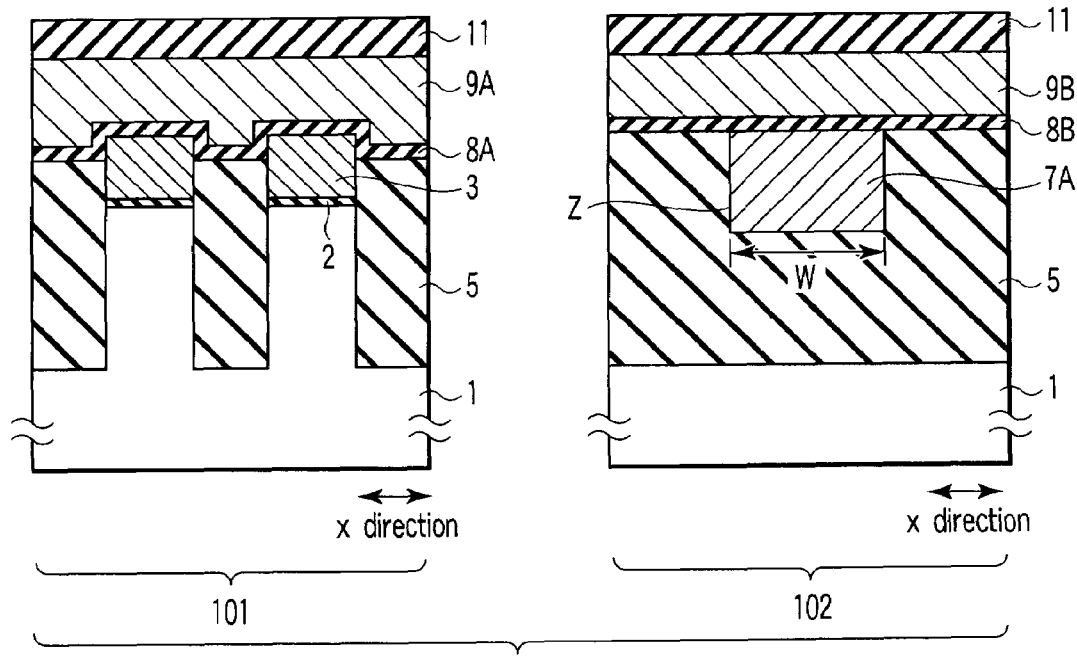
FIG. 2 shows cross-sectional views taken along lines II-II of FIG. 1.
Figure 3:
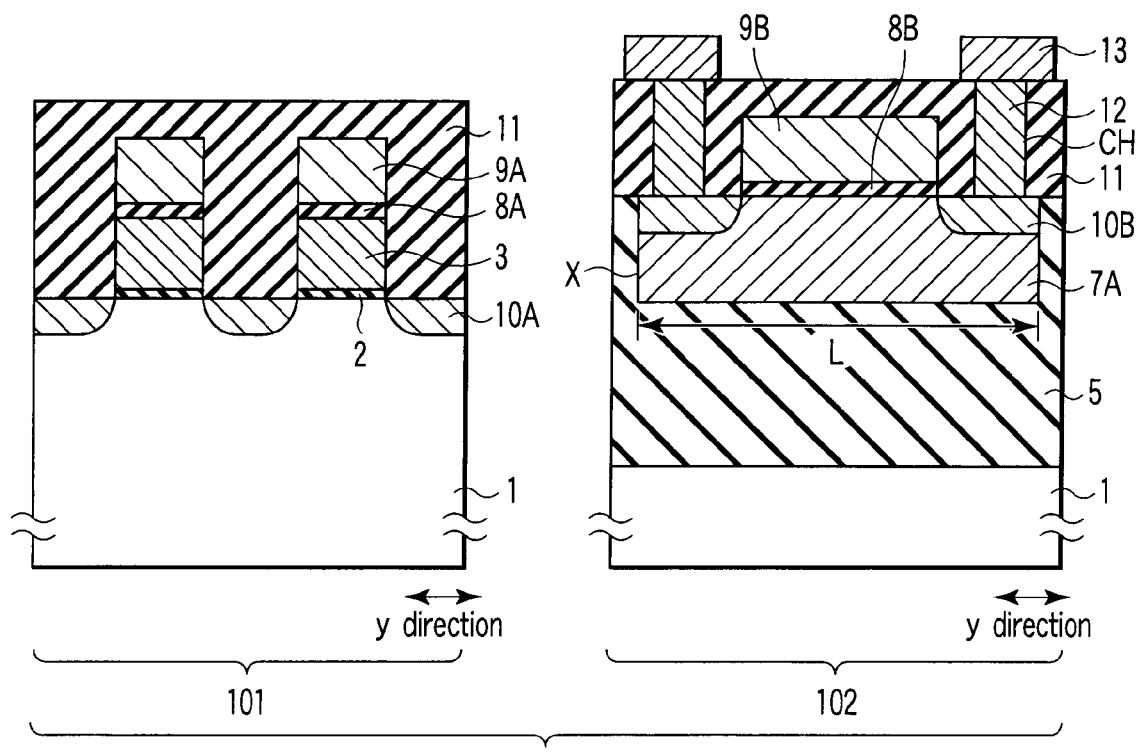
FIG. 3 shows cross-sectional views taken along lines III-III of FIG. 1.

FIG. 1 shows plan views of a memory cell region 101 and a resistor region 102, FIG. 2 shows cross-sectional views taken along lines II-II of FIG. 1, and FIG. 3 shows cross-sectional views taken along lines III-III of FIG. 1.

As for the floating gate electrode 3 of the memory cell transistor in the memory cell region 101, the floating gate electrode 3 is arranged on a gate insulating film (tunnel oxide film) 2 in an active region surrounded by element isolation regions 5. The floating gate electrode 3 is constituted of, for example, a polysilicon film, and is formed by being doped with impurities having such a sufficiently high concentration that depletion of the gate is not caused. Incidentally, the floating gate electrode 3 may be formed of a silicon epitaxial film.

Further, an inter-gate insulating film 8A is formed so as to allow it to cover the top surface and a part of the side surfaces of the floating gate electrode 3. The inter-gate insulating film 8A is an oxide-nitride-oxide (ONO) film. However, the inter-gate insulating film 8A is not limited to the ONO film, but may be a single layer of a silicon oxide film, silicon nitride film, or silicon oxynitride film. Furthermore, the inter-gate insulating film 8A may be a high-dielectric film. In such a case, a single layer film or a laminated layer film including at least one of high-dielectric materials such as alumina, a hafnium oxide, a tantalum oxide, and a lanthanum oxide is used.

Further, a control gate electrode 9A is formed so as to allow it to cover the top surface and a part of the side surfaces of the floating gate electrode 3 through the inter-gate insulating film 8A. By using the structure in which the floating gate electrode 3 and the control gate electrode 9A overlap each other at their side surfaces through the inter-gate insulating film 8A as described above, the coupling ratio can be improved. Further, the control gate electrode 9A functions also as a word line, and hence a material having a low resistivity is used for forming it. Incidentally, the control gate electrode 9A may be a single layer film of a polysilicon film or a laminated film of a polysilicon film and a silicide film.

A source/drain diffusion layer 10A is formed on the surface of a semiconductor substrate 1, and functions as a source/drain of the memory cell transistor. The source/drain diffusion layer 10A is shared with two adjacent memory cell transistors. Further, an insulating layer 11 is formed so as to allow it to cover the entire surface of the memory cell region 101.

In the resistor region 102, a resistor 7A of the resistance element is buried in a depression Z formed in an element isolation insulating layer 5. A depth of the depression Z is formed so as to be about 60 nm to 100 nm when the film thickness of the element isolation insulating layer 5 is 200 nm. Accordingly, the film thickness of the resistor 7A to be buried in the depression Z is equal to or larger than about ⅓ and equal to or less than about ½ of the film thickness of the element isolation insulating layer 5.

The resistor 7A is formed by steps different from those of the floating gate electrode 3. Therefore, according to this embodiment, the resistor 7A and the floating gate electrode 3 can be formed in such a manner that they differ from each other in impurity concentration. For example, the impurity concentration of the resistor 7A is lower than that of the floating gate electrode 3, i.e., the resistivity of the resistor 7A can be higher than that of the floating gate electrode 3.

An intermediate insulating film 8B and an intermediate layer 9B are formed on the top surface of the resistor 7A simultaneously with the inter-gate insulating film 8A and the control gate electrode 9A, respectively.

Diffusion layers 10B are formed at both ends of the resistor 7A so that the resistor 7A and contact parts 12 can obtain an ohmic characteristic. The contact part 12 is buried in a contact hole CH formed in the insulating layer 11 covering the entire surface of the resistor region 102, and connected to the diffusion layer 10B. Further, a metal interconnect layer 13 is formed on the contact part 12. Incidentally, in this embodiment, a resistance element having a two-terminal structure in which diffusion layers 10B and contact parts 12 are arranged at both ends of a resistor 7A will be described. However, the resistance element may have a structure having three or more terminals in which, for example, diffusion layers and contact parts are further arranged between the diffusion layers 10B and the contact parts 12 on both the ends.

As described above, in the floating gate electrode 3 and the resistor 7A which are formed in different steps, a material having a high impurity concentration, such as silicon having an impurity concentration of about $1\times10^{20}/cm^3$ to $5\times10^{20}/cm^3$ can be used as a material for the floating gate electrode 3, and hence depletion of the gate can be avoided.

Further, a material having a low impurity concentration, such as silicon having an impurity concentration of about $1\times10^{18}/cm^3$ to $9\times10^{19}/cm^3$ can be used as a material of the resistor 7A, and by burying a material having a high resistivity in the depression Z, the shape of the resistor can be optimized. Specifically, the line width W of the resistor 7A can be maintained wide, and a stable resistance value can be obtained. Further, by using a material having a high resistivity, the length L of the resistor 7A can be made short, and the size of the resistor region 102 and the chip size can be reduced. Further, by burying the resistor 7A in the depression Z formed in the element isolation insulating layer 5, the capacity caused between the resistor 7A and the semiconductor substrate 1 can be made small.

A method of manufacturing a memory cell region 101 and a resistor region 102 of a flash memory according to an example of the present invention having the structure described above will be described below. In the following, a description will be given assuming that the cross section cut along line II-II shown in FIG. 1 is a cross section in the x-direction, and the cross section cut along line III-III is a cross section in the y-direction. Incidentally, in the memory cell region 101, the x-direction corresponds to the channel width direction of the memory cell transistor, and the y-direction corresponds to the channel length direction of the memory cell transistor.

(2) First Manufacturing Method

A method of manufacturing a memory cell region 101 and a resistor region 102 shown in FIGS. 1 to 3 will be described below with reference to FIGS. 4 to 12.

Figure 4:
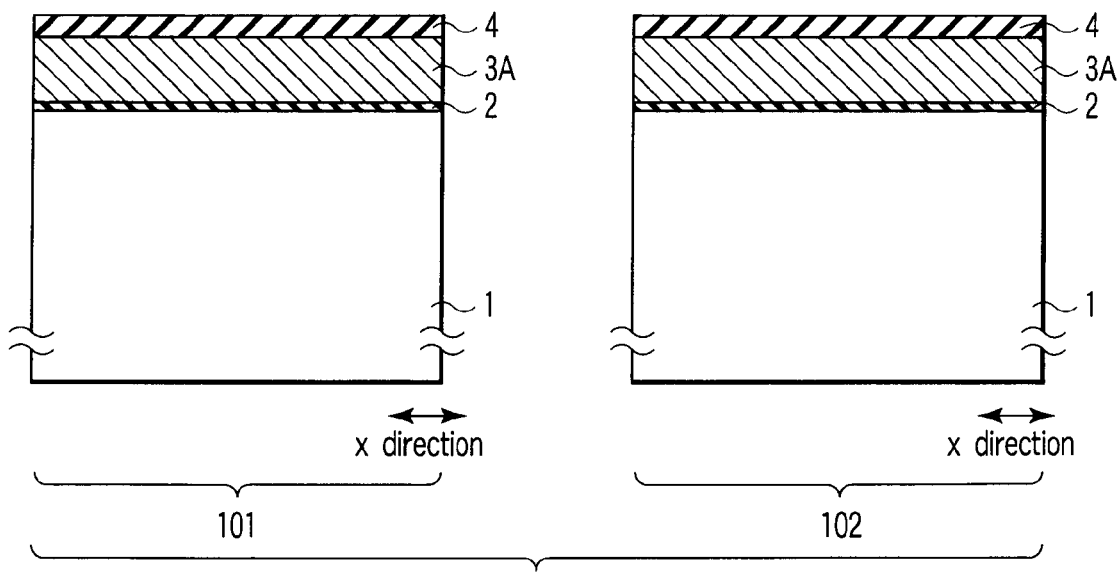
FIG. 4 shows cross-sectional views showing a step of a first manufacturing method.

First, as shown in FIG. 4, for example, a polysilicon film (first conductive material) 3A is formed, as a floating gate electrode material, on a gate insulating film (tunnel oxide film) 2 formed on the surface of a semiconductor substrate 1 at a high impurity concentration (for example, about $1\times10^{20}/cm^3$ to $5\times10^{20}/cm^3$) causing no depletion of the gate by using, for example, the chemical vapor deposition (CVD) method. Thereafter, for example, a SiN film 4 is formed on the polysilicon film 3A as a mask layer.

Figure 5:
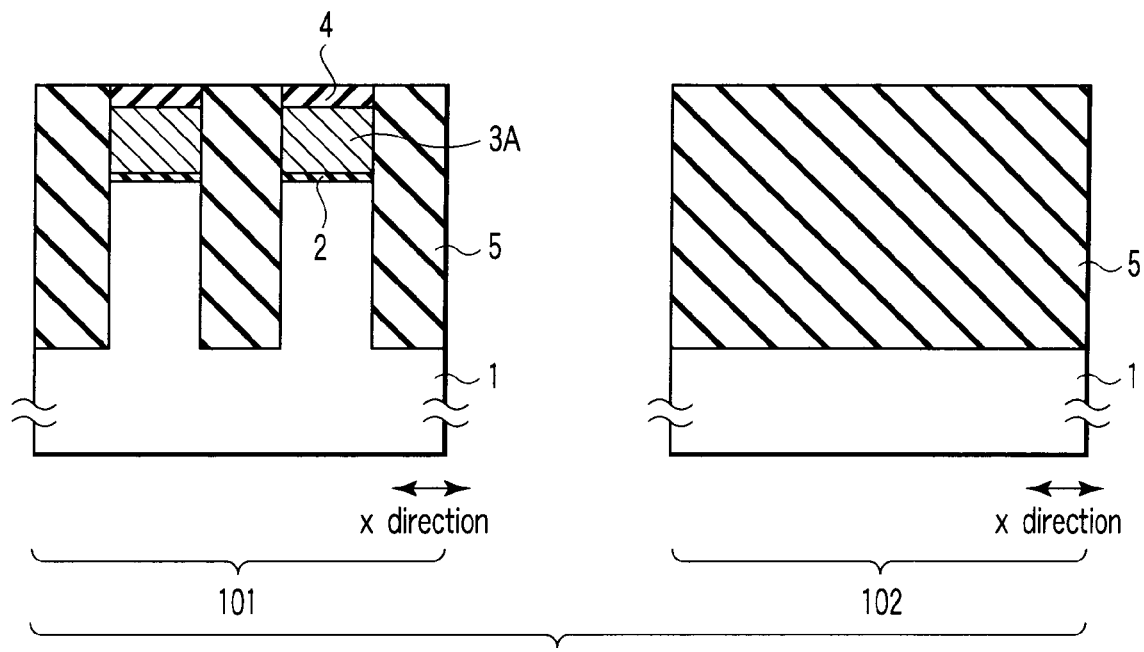
FIG. 5 shows cross-sectional views showing a step of the first manufacturing method.

Then, as shown in FIG. 5, a resist pattern (not shown) is formed on the SiN film 4 by the photolithographic technique, and the SiN film 4 is patterned by using the resist pattern as a mask. After the resist pattern is removed, the SiN film 4, polysilicon film 3A, tunnel oxide film (gate insulating film) 2, and a part of the top surface of the semiconductor substrate 1 in the memory cell region 101 and resistor region 102 are etched in sequence, thereby forming element isolation trenches. At this time, in the resistor region 102, the polysilicon film 3A is removed. Subsequently, for example, a silicon oxide is formed on the entire surface such that the element isolation trenches are buried, and thereafter the silicon oxide is subjected to surface polishing by, for example, the chemical mechanical polishing (CMP) method by using the SiN film 4 as a stopper film. Then, an element isolation insulating layer 5 is formed in each of the memory cell region 101 and the resistor region 102.

Figure 6:
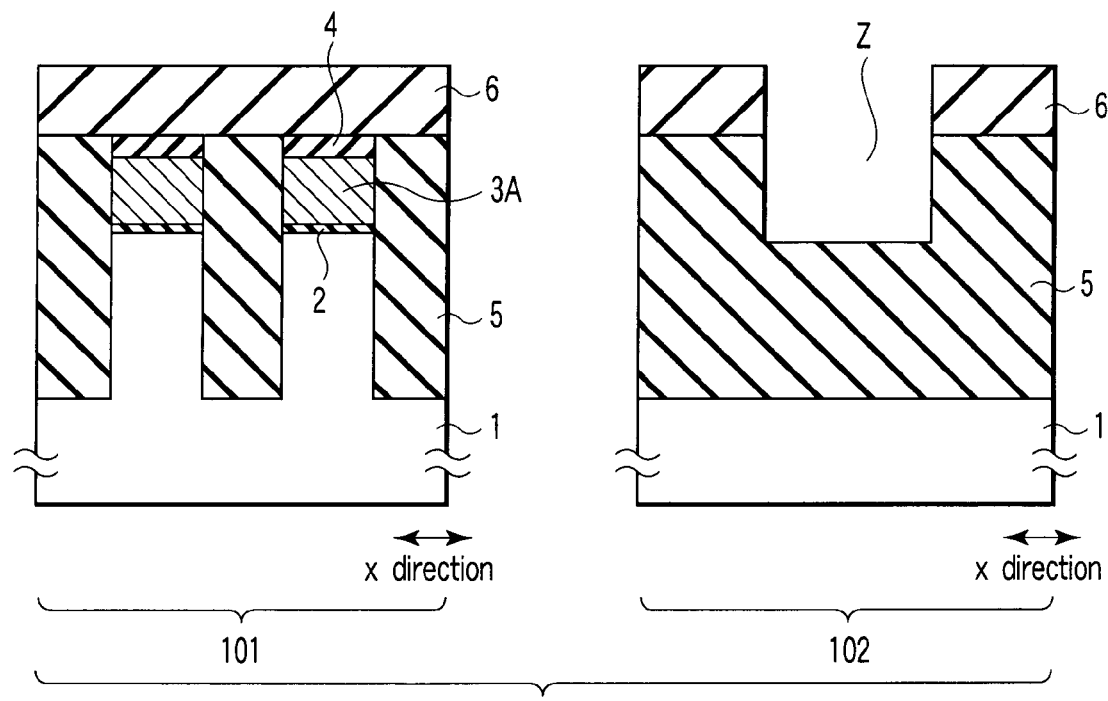
FIG. 6 shows cross-sectional views showing a step of the first manufacturing method.
Figure 7:
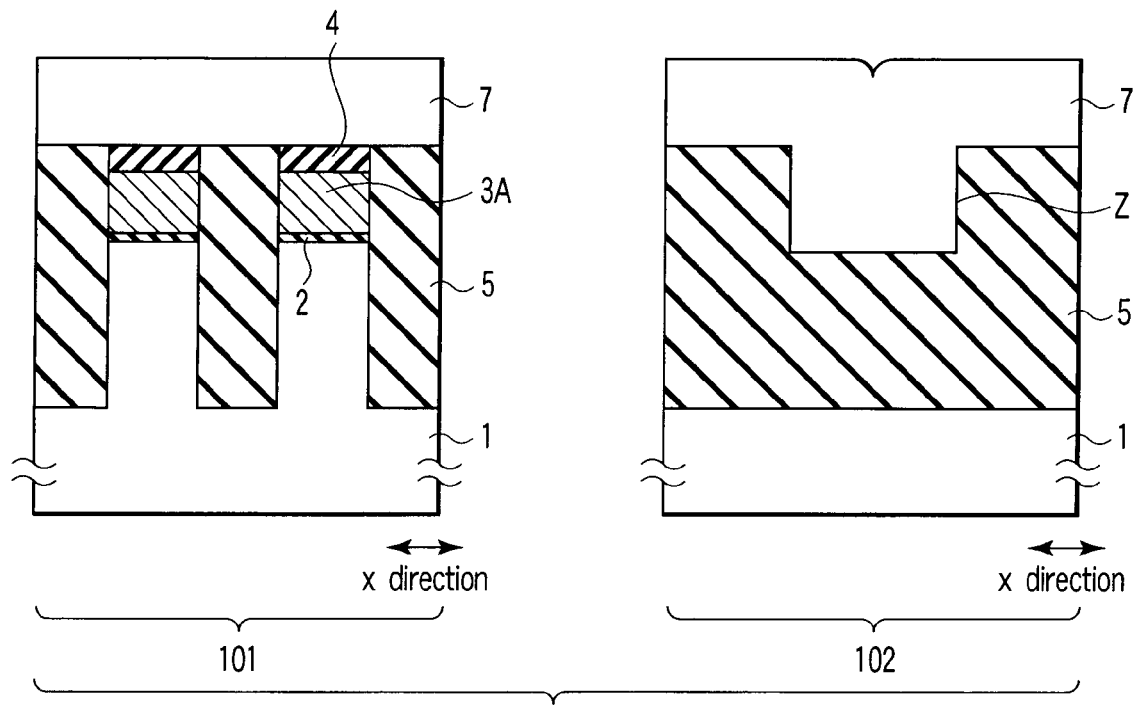
FIG. 7 shows cross-sectional views showing a step of the first manufacturing method.

Subsequently, the top surface of each of the memory cell region 101 and the resistor region 102 is coated with a resist, the surface is then patterned so that a depression having a desired shape can be obtained in the element isolation insulating layer 5 of the resistor region 102, and the surface is etched by, for example, the reactive ion etching (RIE) method. Then, as shown in FIG. 6, a depression Z is formed in the element isolation insulating layer 5 of the resistor region 102 by the resist pattern 6 serving as a mask. The depression Z is formed in such a manner that the depth thereof is about 60 nm to 100 nm when the thickness of the element isolation insulating layer (STI) is, for example, 200 nm.

Then, after the resist pattern is removed, a resistor material 7 constituted of, for example, a genuine polysilicon film is formed on the entire surface of each of the memory cell region 101 and the resistor region 102 such that the depression Z is buried.

Figure 8:
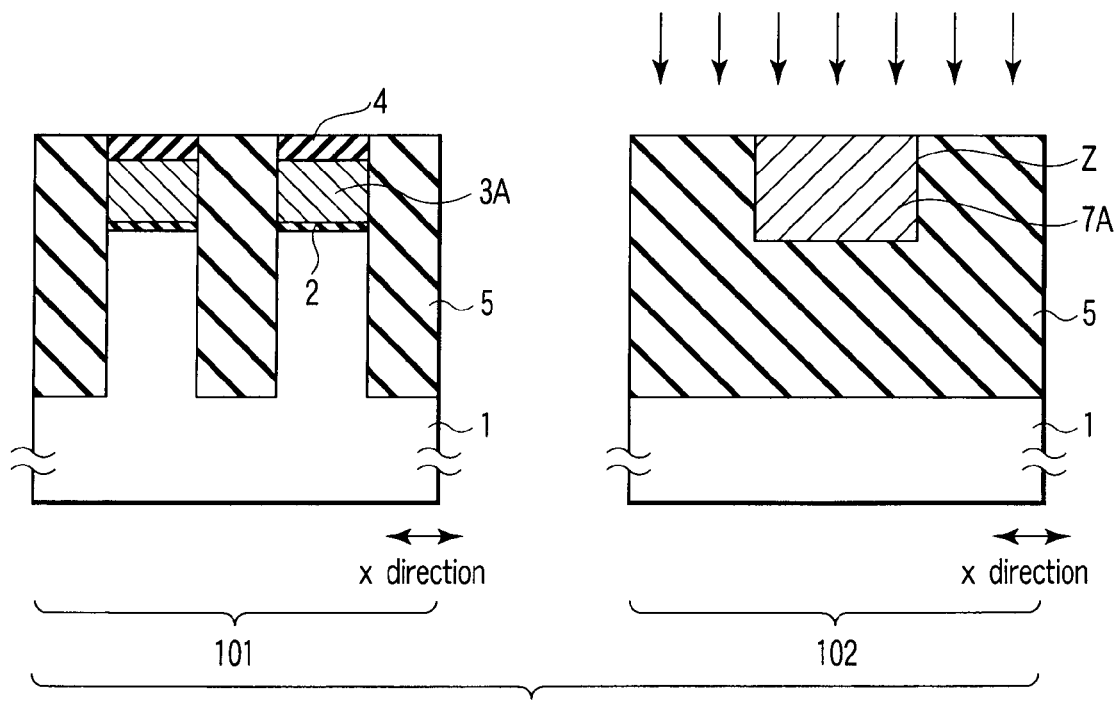
FIG. 8 shows cross-sectional views showing a step of the first manufacturing method.

Subsequently, the resistor material 7 of each of the memory cell region 101 and the resistor region 102 is subjected to etch back by using, for example, dry etching having strong anisotropy so as to allow the resistor material 7 to remove expect in the depression Z, thereby causing the resistor material 7 to remain in the depression Z in a self-aligned manner. At this time, the film thickness of the resistor 7A becomes a thickness of about ⅓ to ½ of the film thickness of the element isolation insulating layer 5. Thereafter, the top surface of the memory cell region 101 is covered with a resist, the resistor region 102 is doped with impurities by the ion implantation method in such a manner that the impurity concentration of the resistor material 7 remaining in the depression Z becomes about $1\times10^{18}/cm^3$ to $9\times10^{19}/cm^3$. Then, as shown in FIG. 8, a resistor 7A constituted of a polysilicon film (second conductive material) having a desired impurity concentration is formed in the depression Z.

Incidentally, in this embodiment, the resistor material 7 is caused to remain in the depression Z in a self-aligned manner by etch back. However, the resistor material 7 may be caused to remain in the depression Z by the CMP method in which the element isolation insulating layer 5 is used as a stopper film. In this case, the resistor 7A can obtain a more flat top surface, thereby making it possible to form a more accurate resistance element.

Figure 9:
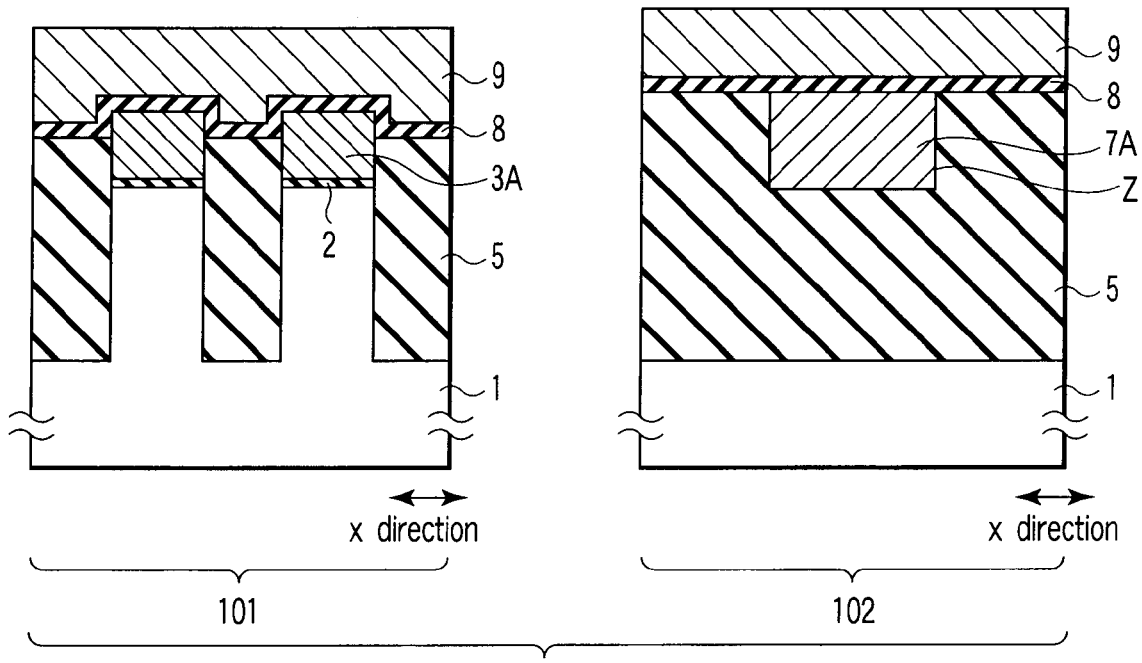
FIG. 9 shows cross-sectional views showing a step of the first manufacturing method.
Figure 10:
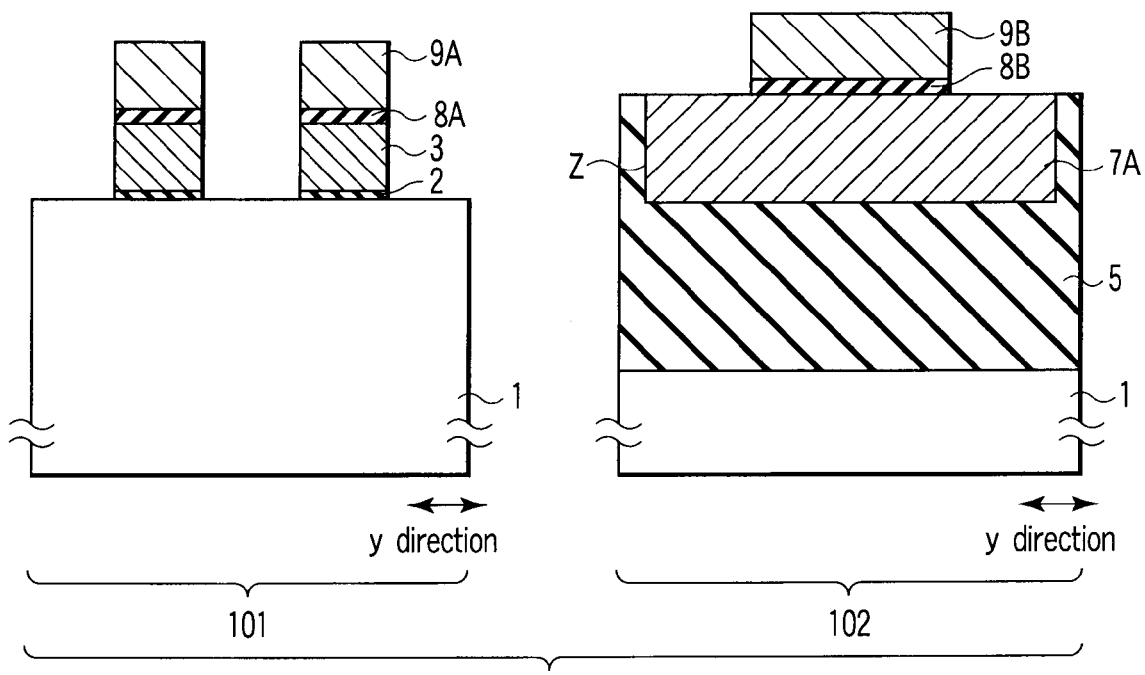
FIG. 10 shows cross-sectional views showing a step of the first manufacturing method.
Figure 11:
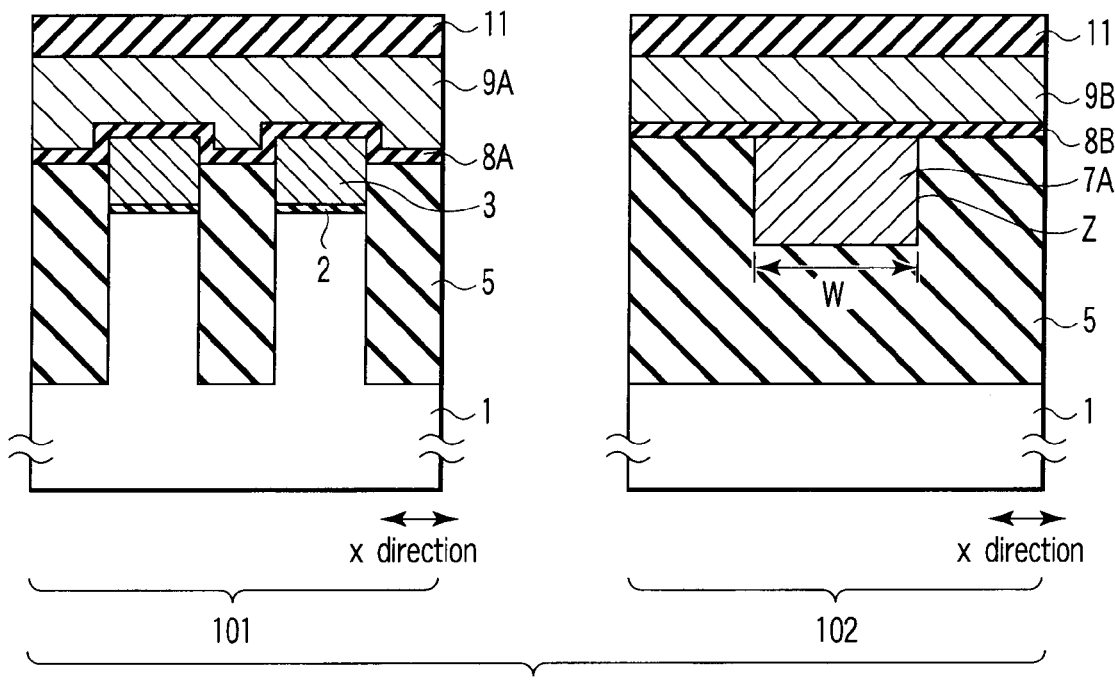
FIG. 11 shows cross-sectional views showing a step of the first manufacturing method.
Figure 12:
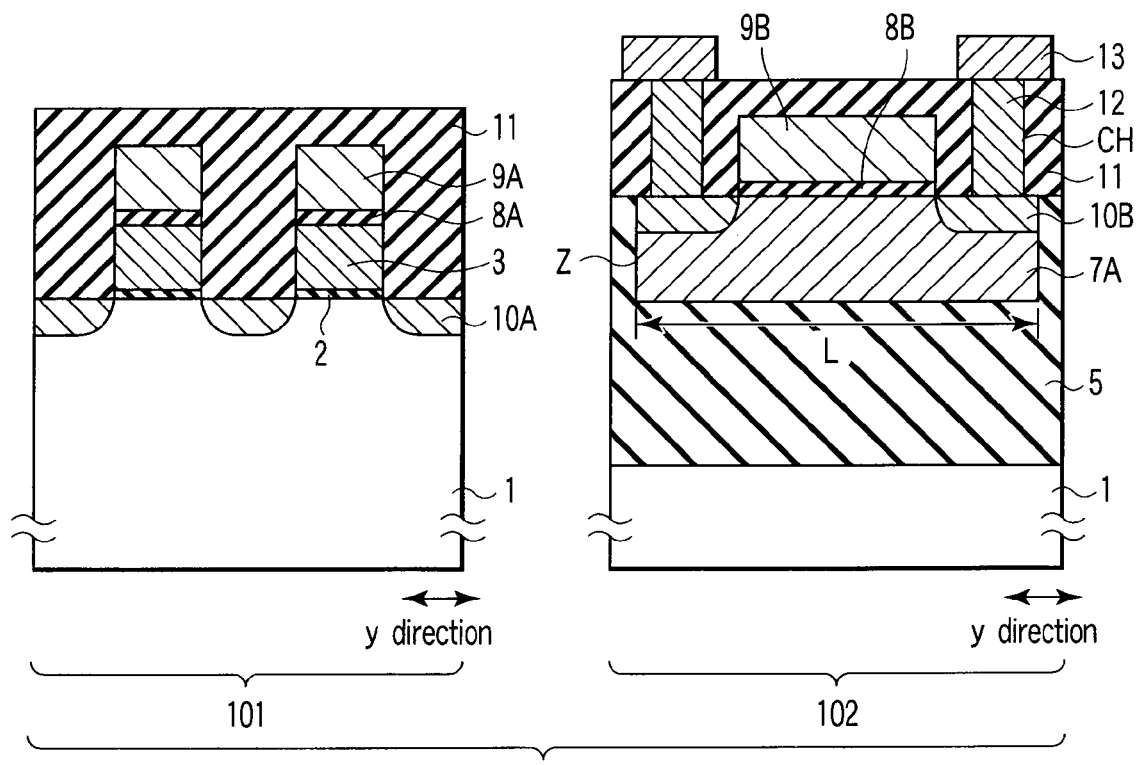
FIG. 12 shows cross-sectional views showing a step of the first manufacturing method.

Then, the top surface of the resistor region 102 is covered with a resist, the mask layer 4 of the memory cell region 101 is removed and the element isolation insulating layer 5 of the memory cell region 101 are subjected to etch back. As a result, the top surface and a part of the side surfaces of the polysilicon film 3A are exposed. Thereafter, as shown in FIG. 9, for example, an ONO film 8 which will become an inter-gate insulating film of the memory cell transistor, and, for example, a polysilicon film (control gate electrode material) 9 which will become a control gate electrode of the memory cell transistor are formed in sequence on the top surface of each of the memory cell region 101 and the resistor region 102 by using, for example, the CVD method. Incidentally, the inter-gate insulating film is not limited to the ONO film, and a single layer film of a silicon oxide or a silicon nitride may be used. Alternatively, the gate insulating film may be a single layer film or a laminated film including at least one of high-dielectric materials such as alumina, a tantalum oxide, a hafnium oxide, and a lanthanum oxide. Further, a silicide film may be further formed on the polysilicon film 9.

Subsequently, the top surface of the polysilicon film 9 is coated with a resist, and a resist pattern desired by the memory cell region 101 or the resistor region 102 is formed thereon by the photolithographic technique. In the memory cell region, by using the resist pattern as a mask, the polysilicon film 9, ONO film 8, polysilicon film 3A, and gate insulating film 2 are etched in sequence, thereby forming a stacked gate electrode of the memory cell and exposing the surface of the semiconductor substrate 1. In the resistor region 102, the polysilicon film 9 and ONO film 8 are etched in sequence, and the surface of the resistor 7A is exposed. Then, as in the cross-sectional views in the y-direction of the memory cell region 101 and the resistor region 102 shown in FIG. 10, the floating gate electrode 3, inter-gate insulating film 8A, and control gate electrode 9A are formed on the tunnel oxide film (gate insulating film) 2 in the memory cell region 101. Further, in the resistor region 102, the intermediate insulating film 8B and the intermediate layer 9B are formed on the resistor 7A.

Subsequently, when doping of impurities is performed by using the control gate electrode 9A and the intermediate layer 9B as a mask by, for example, the ion implantation method, diffusion layers 10A and 10B are respectively formed in the semiconductor substrate 1 of the memory cell region 101 and in the resistor 7A of the resistor region 102 in a self-aligned manner. Incidentally, diffusion layer 10A and 10B may be formed the same time in the semiconductor substrate 1 of the memory cell region 101 and resistor 7A of resistor region 102. Subsequently, an insulating layer 11 is formed on the entire surface of each of the memory cell region 101 and the resistor region 102. Thereafter, in the resistor region 102, contact parts 12 are connected to the diffusion layers 10B through the contact holes CH formed in the insulating layer 11. Further, metal interconnect layers 13 are formed on the contact parts 12, thereby completing a flash memory in this embodiment.

In the flash memory manufactured by the above-mentioned steps, the floating gate electrode 3 of the memory cell transistor and the resistor 7A of the resistance element are formed by the different steps, and hence the floating gate 3 can be formed by using a material having a high impurity concentration, and the resistor 7A can be formed by using a material having a low impurity concentration.

Accordingly, the floating gate electrode 3 can avoid depletion of the gate.

On the other hand, in the resistor 7A, the resistivity can be made high and, in addition, it becomes possible to optimize the shape and characteristic of the resistor by burying the resistor in the depression formed in the element isolation insulating layer 5. In other words, the line width of the resistor can be made wide, whereby a stable resistance value can be obtained. Further, when a desired resistance value is obtained, a resistor material having a high resistivity can be used, and hence a length L of the resistor can be made shorter than when a resistor material having a low resistivity is used, thereby reducing the chip size.

Furthermore, by virtue of the structure in which the resistor is buried in the depression of the element isolation insulating layer, the capacity produced between the resistance element and the substrate can also be made small.

(3) Second Manufacturing Method

The method of forming the floating gate electrode of the memory cell transistor is not limited to the method described in the first manufacturing method. For example, the floating gate electrode thereof can also be formed by using selective epitaxial growth (hereinafter referred to as SEG).

By forming the floating gate electrode using SEG, it becomes possible to miniaturize and optimize the memory cell transistor. Accordingly, the chip area can be reduced and the yield can be improved.

A method of manufacturing a memory cell region 101 and a resistor region 102 shown in FIGS. 1 to 3 in the case where a floating gate electrode is formed by SEG will be described below with reference to FIGS. 13 to 19.

Figure 13:
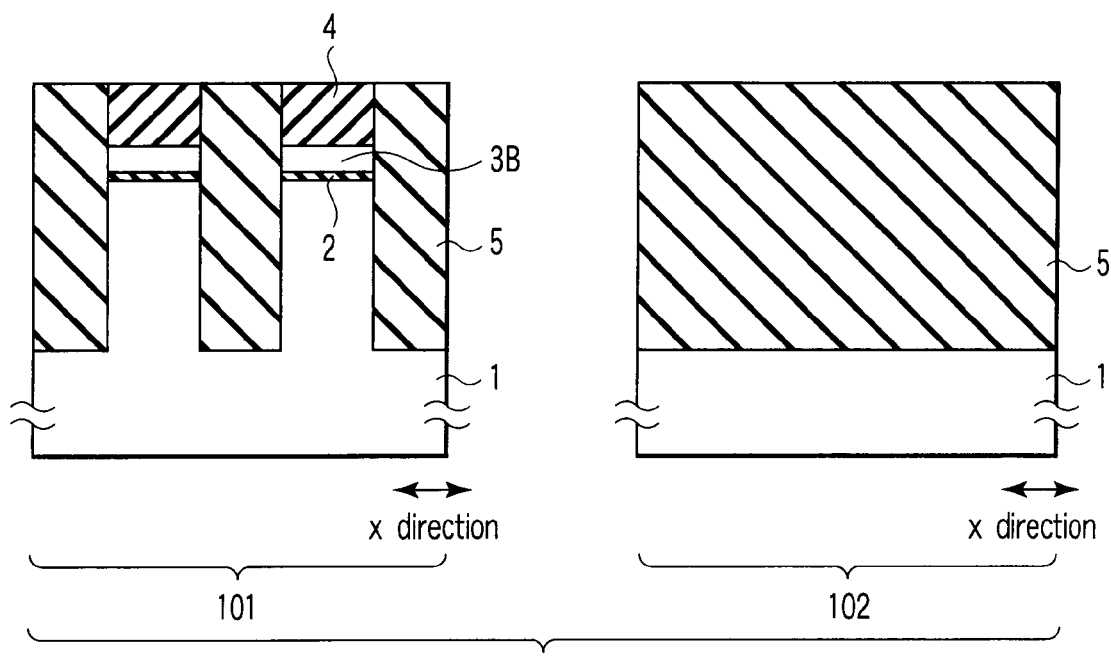
FIG. 13 shows cross-sectional views showing a step of a second manufacturing method.

First, a genuine polysilicon film 3B and a mask layer 4 are formed in sequence on a gate insulating film (tunnel insulating film) 2 as shown in FIG. 13 by the same steps as those shown in FIGS. 4 and 5 of the first manufacturing method. Thereafter, an element isolation insulating layer 5 is formed in each of the memory cell region 101 and the resistor region 102. The genuine polysilicon film 3B is a foundation layer used when the epitaxial film is formed by SEG.

Figure 14:
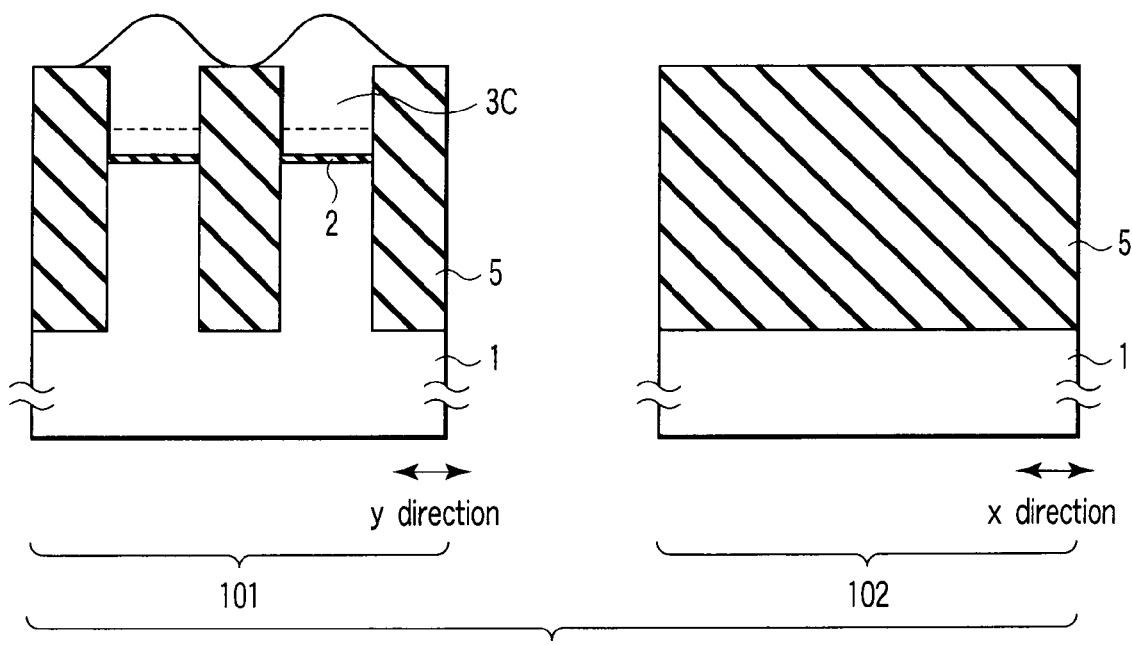
FIG. 14 shows cross-sectional views showing a step of the second manufacturing method.

Subsequently, the mask layer 4 is removed and, after the surface of the genuine polysilicon film 3B is exposed, SEG is performed by, for example, mixing an appropriate amount of an HCl gas into a source gas under reduced pressure. As a result, nucleus growth of silicon is suppressed on the surface of the element isolation insulating layer 5, and hence a silicon film is not formed thereon, and a silicon film is epitaxially grown selectively only on the genuine polysilicon film 3B. Then, as shown in FIG. 14, a silicon epitaxial film 3C is formed on the gate insulating film 2. At this time, there is no interface at the boundary (broken line) between the genuine polysilicon film serving as the foundation layer and the silicon film grown on the genuine polysilicon film, and a continuous epitaxial film is formed. It is possible to form a floating gate electrode having a uniform film thickness and film quality by SEG even when the interval between two element isolation layers 5 in the memory cell region 101 is small.

Figure 15:
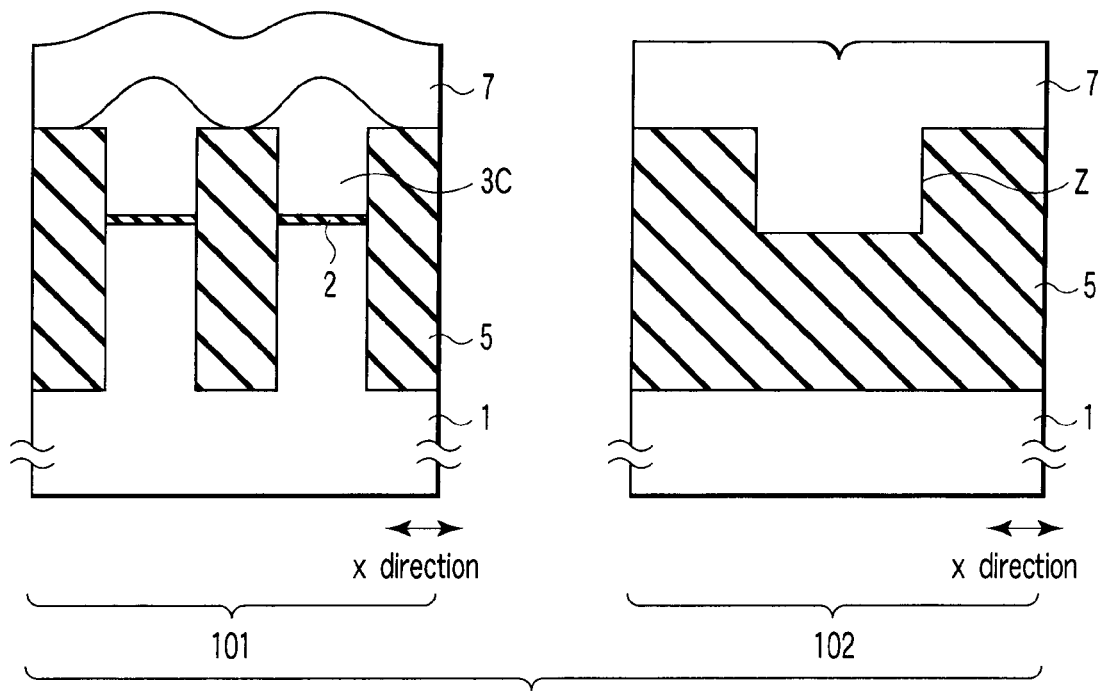
FIG. 15 shows cross-sectional views showing a step of the second manufacturing method.

Subsequently, after a depression Z is formed in the element isolation insulating layer 5 of the resistor region 102, when a resistor material 7 constituted of, for example, a genuine polysilicon film is formed in each of the memory cell region 101 and the resistor region 102, the regions 101 and 102 become as shown in FIG. 15.

Thereafter, the resistor material 7 and the silicon epitaxial film 3C of each of the memory cell region 101 and the resistor region 102 are subjected to etch back by using, for example, dry etching having strong anisotropy such that the resistor material 7 fills up the depression Z, thereby causing the resistor material 7 to remain in the depression Z in a self-aligned manner. Incidentally, the resistor material 7 may be caused to remain in the depression in a self-aligned manner by using CMP in place of etch back.

Figure 16:
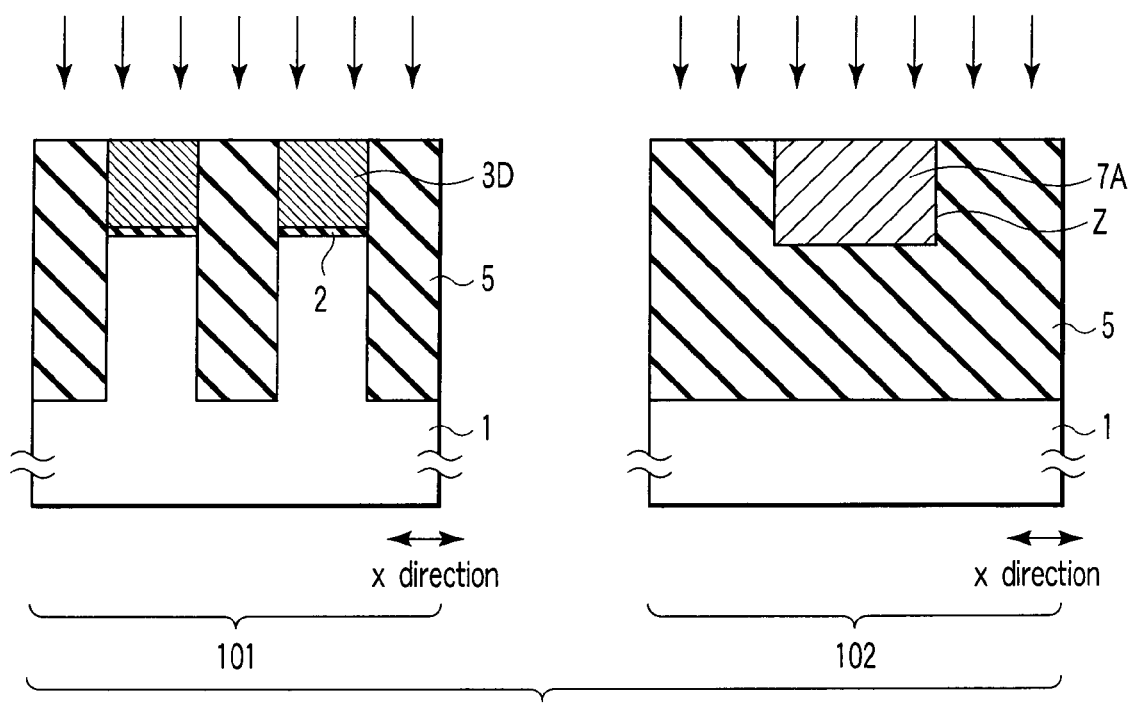
FIG. 16 shows cross-sectional views showing a step of the second manufacturing method.

Thereafter, the memory cell region 101 and the resistor region 102 are doped with impurities by the ion implantation method in such a manner that the impurity concentration of the resistor material 7 remaining in the depression Z becomes about $1\times10^{18}/cm^3$ to $9\times10^{19}/cm^3$. Then, a resistor 7A is formed in the resistor region 102 as shown in FIG. 16. Further, a silicon epitaxial film 3D doped with impurities is formed in the memory cell region 101.

Further, as shown in FIG. 17, a cover film 14 constituted of, for example, SiN is formed on the top surface of the resistor region 102. Thereafter, the semiconductor substrate 1 is subjected to a heat treatment in, for example, an impurity gas atmosphere which is diluted by an inert gas or a hydrogen gas, to thereby perform diffusion of impurities by gas phase doping (GPD) so that a floating gate electrode having an impurity concentration (for example, about $1\times10^{20}/cm^3$ to $5\times10^{20}/cm^3$) that does not cause depletion of the gate can be formed. Then, a silicon epitaxial film 3E doped with impurities of a high concentration is formed. At this time, the entire surface of the resistor region 102 is covered with the cover film 14, and hence diffusion of impurities by GPD does not occur in the resistor 7A. By dispersing impurities in the silicon epitaxial film 3E by using GPD, the epitaxial film can be prevented from being damaged by accelerated ions unlike in the case where impurity implantation is performed by the ion implantation method. As a result, crystallinity of the silicon epitaxial film 3E can be maintained. However, impurities may be implanted in the silicon epitaxial film 3E by the ion implantation method.

Figure 19:
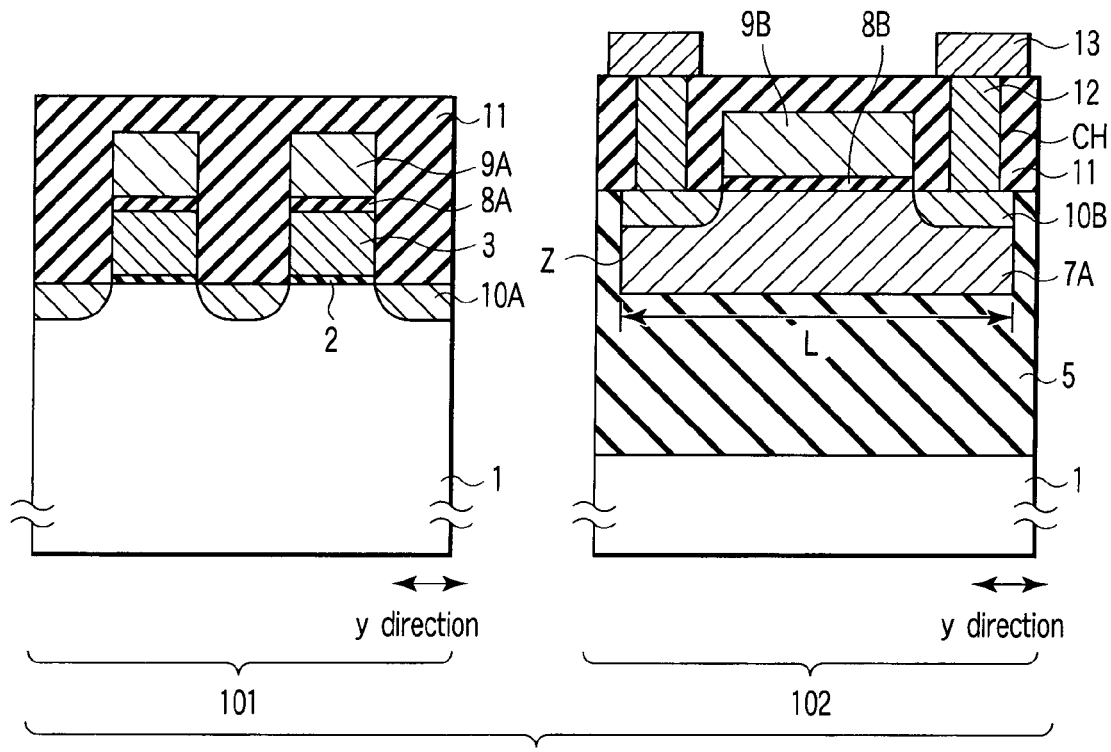
FIG. 19 shows cross-sectional views showing a step of the second manufacturing method.

Subsequently, after the cover film 14 of the resistor region 102 is removed, when the same steps as those of the first manufacturing method shown in FIGS. 9 to 12 are performed, a floating gate electrode 3, inter-gate insulating film 8A, and control gate electrode 9A are formed in sequence on the tunnel oxide film (gate insulating film) 2 in the memory cell region 101 as shown in FIGS. 18 and 19. In the resistor region 102, an intermediate insulating film 8B and an intermediate layer 9B are formed in sequence on the resistor 7A. Furthermore, diffusion layers 10A and 10B are formed in a self-aligned manner by using the control gate electrode 9A and the intermediate layer 9B as masks.

Further, after an insulating layer 11 is formed on the entire surface of each of the memory cell region 101 and the resistor region 102, in the resistor region 102, contact parts 12 are connected to the diffusion layers 10B through contact holes CH formed in the insulating layer 11, and metallic wires 13 are further formed on the contact parts 12. Incidentally, in this manufacturing method, although the cover film (SiN film) formed on the resistor 7A is removed, the cover film may not be removed. In such a case, the intermediate insulating film 8B and the intermediate layer 9B are formed in sequence on the cover film. And, in the region in which the diffusion layer 10B is formed, the intermediate insulating film 8B, intermediate layer 9B, and cover film are removed in sequence. Thereafter, a diffusion layer 11B is formed on the surface of the resistor 7A by using the intermediate layer 9B as a mask in a self-aligned manner.

By the steps described above, the flash memory of this embodiment is completed.

As described above, as in the first manufacturing method, in the flash memory manufactured by the second manufacturing method too, the floating gate electrode 3 can be formed by using a material having a high impurity concentration, and the resistor 7A can be formed by using a material having a low impurity concentration.

Accordingly, the floating gate electrode 3 can avoid depletion of the gate. Further, by forming the floating gate electrode 3 by using SEG, miniaturization and optimization of the memory cell transistor is enabled, the chip area can be reduced and the yield can be improved.

On the other hand, the resistivity of the resistor 7A can be enhanced and, in addition, by burying the resistor 7A in the depression formed in the element isolation insulating layer 5, it becomes possible to optimize the shape and the characteristic of the resistor. In other words, it becomes possible to make the line width W of the resistor wide, and hence a stable resistance value can be obtained. Further, when a desired resistance value is obtained, a resistor material having a high resistivity can be used, and hence the length L of the resistor can be further shortened and the chip size can be further reduced as compared with a case where a resistor material having a low resistivity is used.

Furthermore, by virtue of the structure in which the resistor is buried in the depression in the element isolation insulating layer, the capacity produced between the resistance element and the substrate can also be made small.

3. Application Example

Figure 20:
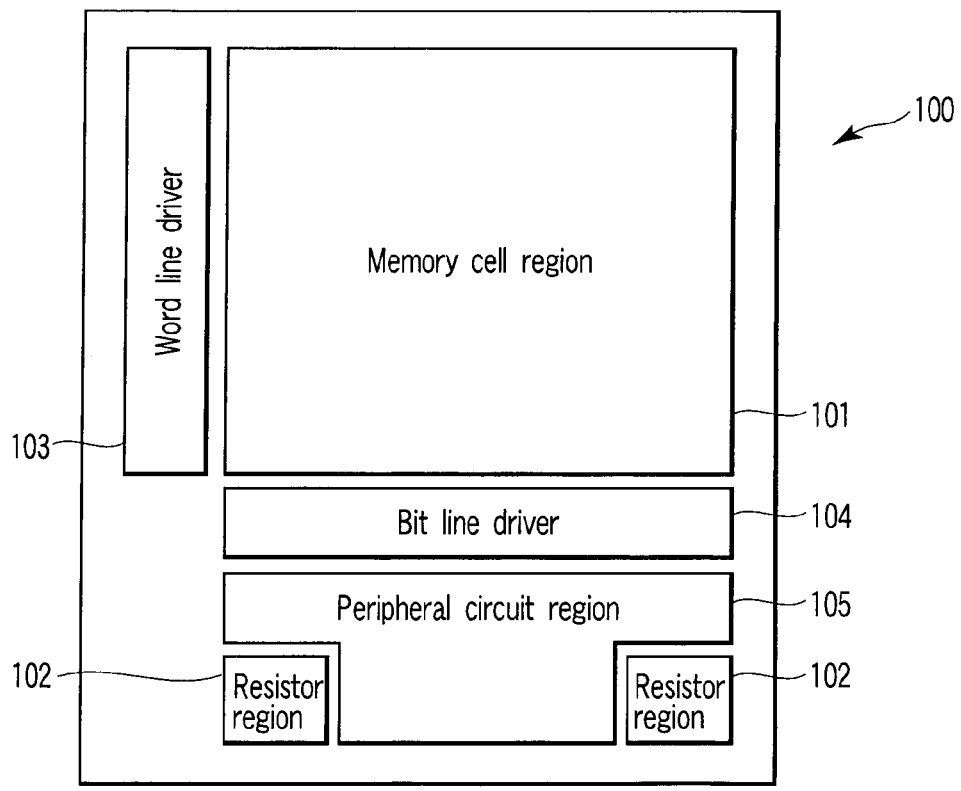
FIG. 20 is a layout view showing an example to which the embodiment of the present invention is applied.

FIG. 20 shows an application example of the embodiment of the present invention. The embodiment of the present invention can be applied to, for example, a flash memory such as a NAND type or a NOR type flash memory.

A flash memory 100 shown in FIG. 20 is constituted of a memory cell region 101, word line driver 103, bit line driver 104, peripheral circuit 105, and resistor region 102.

The memory cell region 101 is connected to the peripheral circuit region 105 through the bit line driver 104. The resistor region 102 includes a resistance element which is manufactured in the embodiment described above and in which the shape and the characteristic are optimized, and can be arranged so as to allow it to be incorporated in a part of the peripheral circuit region 105. Accordingly, according to the embodiment of the present invention, the chip size of the flash memory 100 can be reduced.

Further, when the flash memory 100 according to the embodiment of the present invention is used, its resistance element has a high resistivity, and hence the degree of freedom is high with respect to optimization of the shape and the characteristic. Accordingly, it is possible to flexibly cope with a change in the shape or chip layout incidental to a change in the cell shape of the memory cell transistor.

4. Others

According to the embodiment of the present invention, an optimized resistance element can be formed on the semiconductor substrate and, moreover, the chip size can be reduced.

The example of the present invention is not limited to the embodiment described above, and each constituent element can be modified and concretized within the scope not deviating from the gist of the invention. Further, by appropriately combining a plurality of constituent elements disclosed in the embodiment described above with each other, various inventions can be constituted. For example, some of the constituent elements may be deleted from the entire constituent elements disclosed in the embodiment described above, and constituent elements of different embodiments may be appropriately combined with each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a semiconductor substrate including a surface having a memory cell region and a resistor region;
an active area extending along a first direction in the memory cell region;
a gate insulating film formed on the active area;
a floating gate electrode formed on the gate insulating film, the floating gate electrode including a first upper portion and a first bottom portion contacting to the gate insulating film;
a trench located adjacent to the active area and extending along the first direction in the memory cell region, the trench including an inner bottom portion which is lower than the surface of the semiconductor substrate;
a first insulating film embedded in the trench, the first insulating film including a second upper portion which is higher than the first bottom portion and lower than the first upper portion of the floating gate electrode relative to the surface of the semiconductor substrate;
a second insulating film formed in the resistor region, the second insulating film including a third upper portion which is higher than the first upper portion of the floating gate electrode relative to the surface of the semiconductor substrate and a recess formed at the third upper portion;

a resistor portion formed in the recess of the second insulating film, the resistor portion including a fourth upper portion which is flush with the third upper portion;

an inter-gate insulating film formed on the first upper portion of the floating gate electrode; and a control gate electrode formed on the inter-gate insulating film, wherein the floating gate electrode includes a first conductive material having a first impurity concentration and the resistor portion includes a second conductive material having a second impurity concentration which is lower than the first impurity concentration of the first conductive material.

2. The nonvolatile semiconductor memory according to claim 1, further comprising:

an intermediate insulating film formed on the fourth upper portion of the resistor portion and having the same thickness as that of the inter-gate insulating film;

an intermediate layer formed on the intermediate insulating film and having the same thickness as that of the control gate electrode;

a diffusion layer formed in the resistor portion; and a contact part connected to the diffusion layer.

3. The nonvolatile semiconductor memory according to claim 1, wherein a film thickness of the resistor portion is ⅓ to ½ of a film thickness of the second insulating film.

4. The nonvolatile semiconductor memory according to claim 1, wherein the floating gate electrode is an epitaxial film.

5. The nonvolatile semiconductor memory according to claim 1, wherein the inter-gate insulating film is a high-dielectric film.

6. The nonvolatile semiconductor memory according to claim 5, wherein the high-dielectric film includes at least one of alumina, a hafnium oxide, a tantalum oxide, and a lanthanum oxide.

7. The nonvolatile semiconductor memory according to claim 1, wherein the impurity concentration is $1 \times 10^{20}/cm^3$ to $5 \times 10^{20}/cm^3$.

8. The nonvolatile semiconductor memory according to claim 1, wherein the second impurity concentration is $1 \times 10^{18}/cm^3$ to $9 \times 10^{19}/cm^3$.

* * * * *